United States Patent [19]

Hennessy et al.

[11] Patent Number: 5,332,987
[45] Date of Patent: Jul. 26, 1994

[54] LARGE GAP MAGNETIC SUSPENSION SYSTEM WITH SUPERCONDUCTING COILS

[75] Inventors: Michael J. Hennessy, Ballston Lake; Richard T. Woods, Scotia; Hung B. Zou, Troy; Robert E. Wilcox, Westerlo; F. Scott Murray, Schenectady, all of N.Y.

[73] Assignee: Intermagnetics General Corporation, Guilderland, N.Y.

[21] Appl. No.: 923,328

[22] Filed: Jul. 31, 1992

[51] Int. Cl.⁵ .......................... H01F 1/00; H02K 7/09; H01H 47/00
[52] U.S. Cl. .................................. 335/216; 335/299; 310/90.5; 361/144
[58] Field of Search .................. 335/216, 296, 299; 310/90.5; 361/144, 143, 139, 146; 156/DIG. 62

[56] References Cited

U.S. PATENT DOCUMENTS

| | | | |
|---|---|---|---|
| 2,566,221 | 5/1949 | Lovell | 310/90.5 |
| 2,686,865 | 8/1954 | Kelly | 156/DIG. 62 |
| 3,370,205 | 9/1965 | Dukes | 310/90.5 |
| 3,512,852 | 5/1970 | North | 310/90.5 |
| 3,815,963 | 6/1974 | Wilk | 310/90.5 |
| 4,554,610 | 11/1985 | Metz | 361/144 |
| 4,585,282 | 4/1986 | Bosley | 310/90.5 |
| 5,168,183 | 12/1992 | Whitehead | 310/90.5 |

FOREIGN PATENT DOCUMENTS 0202183  8/1989  Japan ..................... 335/216

Primary Examiner—Lincoln Donovan
Assistant Examiner—Stephen Ryan
Attorney, Agent, or Firm—Helfgott & Karas

[57] ABSTRACT

A magnetic suspension system and a procedure for operating the system employ a superconducting magnet having a lift coil assembly for developing a magnetic field to interact with the magnetic field of an object to be supported about the superconducting magnet. Smaller and larger magnet coils are provided in the superconducting magnet with counter rotating flow of current to introduce a depression in a potential energy surface above the superconducting magnet, this allowing the object to seek a height at the depression for stably locating the object. The system and methodology employs a set of control coils which are energized to orient and to translate the object to maintain a desired position and orientation. Pairs of the control coils are energized to produce a tilting of the object, as in roll or pitch, or a displacement of the object relative to the vertical axis.

31 Claims, 12 Drawing Sheets

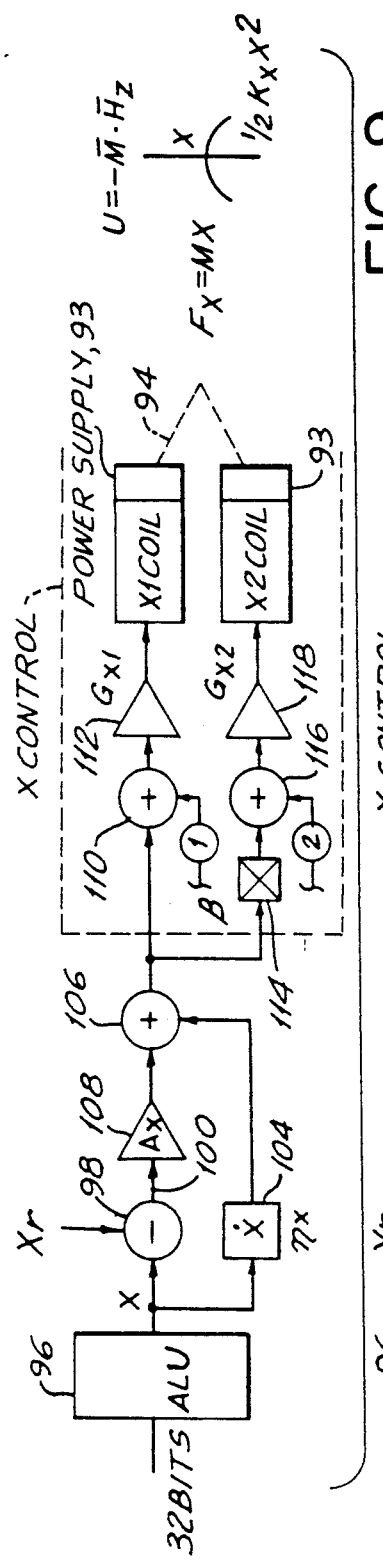
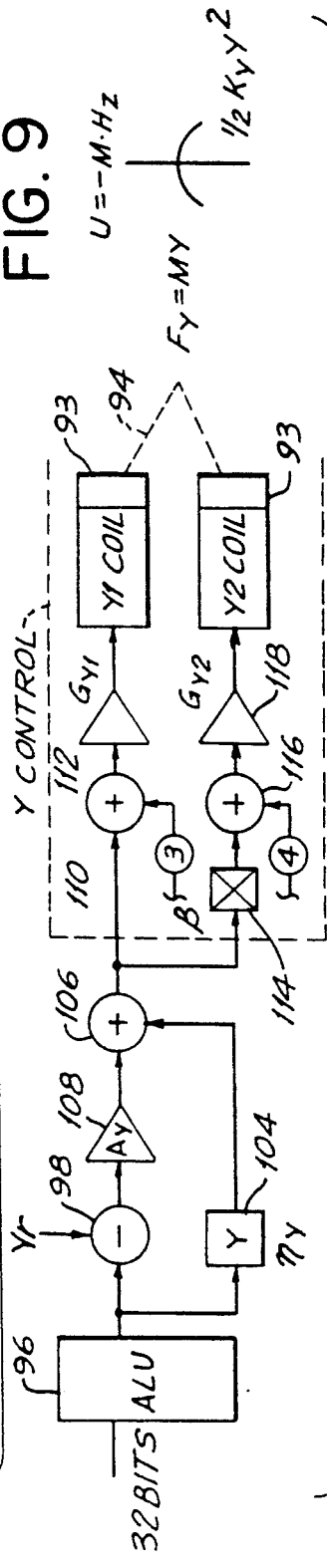
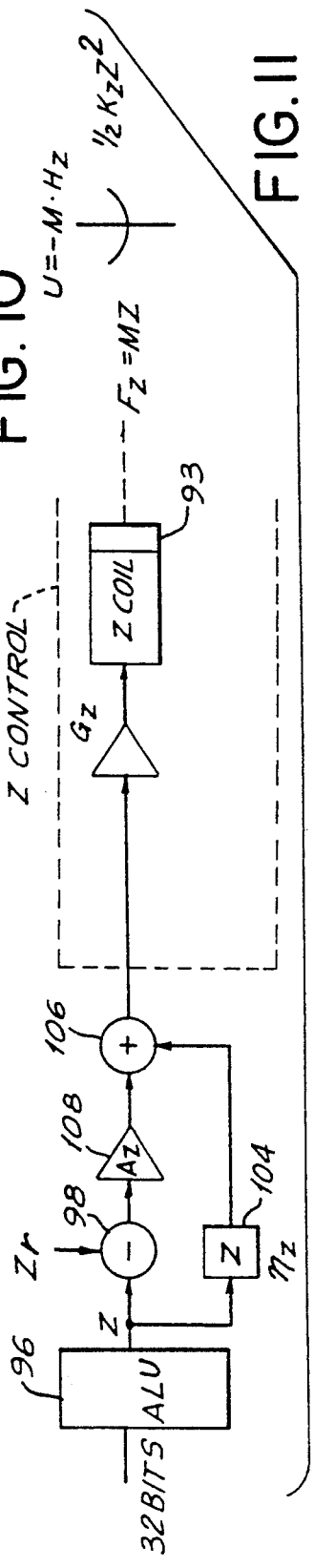
FIG. 9
FIG. 10
FIG. 11

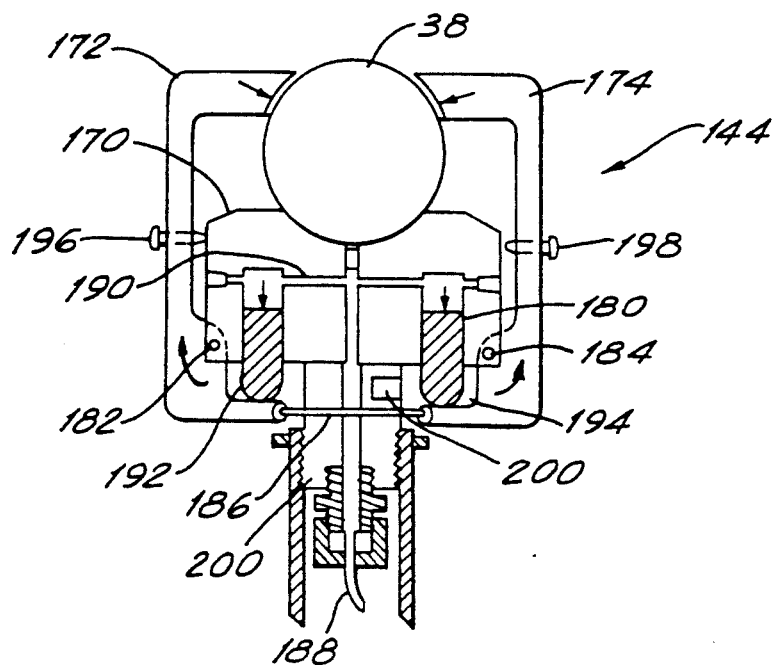
FIG. 15
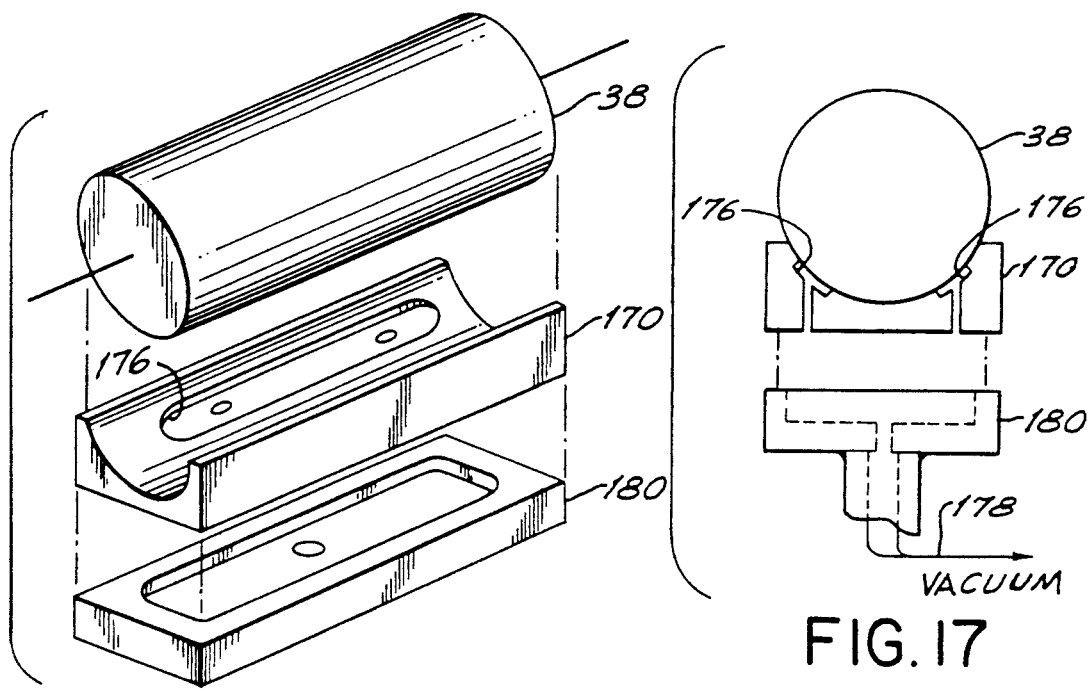
FIG. 16
FIG. 17

LARGE GAP MAGNETIC SUSPENSION SYSTEM WITH SUPERCONDUCTING COILS

BACKGROUND OF THE INVENTION

This invention relates to the suspension of an object in space by magnetic levitation and, more particularly to the use of a set of coil assemblies which are symmetrically positioned about a central vertical axis, and are selectively energized, for providing both lift and directional stability to the object. The object, to be referred to herein as a model, consists of permanent magnet material with the magnetization in the direction of the vertical axis. The coil assemblies include a main superconducting coil assembly for providing lift, and sets of control, or gradient, coils for providing positional and directional stability, wherein the control coils are constructed in a flat pie form, and also in a circular cylindrical form. The control coils are located outside of a superconducting coil of the superconducting coil assembly.

The suspension of objects in free space, distant from any physical support, is useful in certain situations for conducting various forms of tests and measurements. Of particular interest herein is the suspension of a model by magnetic levitation under conditions wherein the model can be held essentially motionless and with precise control over the orientation of the model. Furthermore, the system of magnets which is to be employed for holding and orienting the model is to be located at a distance from the model, and below the model, so as to provide unimpeded access to the model for the conduction of experiments and measurements.

A problem arises in that presently available magnetic suspension systems do not provide all of the foregoing features. The problem may be appreciated from the fact that the laws of physics dictate that one cannot generate a field that will keep a permanent magnet, such as that employed in the model, stable in all degrees of freedom if the field source is below the permanent magnet. Therefore there is a need for active control by use of control coils driven with electric currents from a control system. In the past, equilibrium has been obtained by suspending an object from a magnet coil against the force of gravity with the attendant disadvantage that the space above the object is cluttered and may well interfere with utilization of the object.

SUMMARY OF THE INVENTION

The aforementioned problem is overcome and other advantages are provided by a magnetic suspension system employing a superconducting lift coil assembly for developing a magnetic field to hold the model above the lift coil assembly against the force of gravity. The lift coil assembly comprises two superconducting circular cylindrical coils disposed about a common central vertical cylindrical axis, with a first of the coils being of larger diameter than the second coil. In a preferred embodiment of the invention, the smaller-diameter superconducting coil is positioned at a higher level than the larger-diameter superconducting coil, however, the lift coil assembly is operative even with overlap of the two superconducting coils. In the three-axis coordinate system, the Z axis is the central vertical axis, while the X axis and the Y axis define a horizontal plane.

Furthermore, in accordance with the invention, there is provided a set of assemblies of control, or gradient, coils to provide positional and directional stability of the model about all three orthogonal axes of the three-axis coordinate system. In the preferred embodiment of the invention, the control coils are located outside of the smaller-diameter superconducting magnet and above the larger-diameter superconducting coil, and are disposed symmetrically about the foregoing central axis. The set of control coil assemblies includes a pair of X coils positioned on opposite sides of the Z axis and centered on the X-Z plane for developing both a displacement force along the X axis, and a tilting force upon the model.

Combination of magnetic fields of these control coils, with adjustment of direction and intensity of their respective fields produces pure translational or pure tilting forces as may be required to adjust the position and the orientation of the model. A second pair of Y coils having the same construction as the foregoing X coils, is located in the Y-Z plane to provide translation of the model in the Y direction and tilt about a rotational axis orthogonal to that of the first-mentioned tilt. TO facilitate description of the invention, it is presumed that the model is aligned along the X axis, and has an elongated form. Thus, a tilt provided by the X coils constitutes a pitching of the model, and a tilt provided by the Y coils constitutes a rolling of the model.

The superconducting lift coil assembly establishes a magnetic field which is symmetrical about the Z axis, and has a potential energy profile along the Z axis with a depression at the location of the model to stabilize the Z-axis coordinate of the model's location. The model is stable also in roll and in pitch. However, in the X and the Y directions, the equilibrium provided by the magnetic field of the superconducting coils is unstable, and must be supplemented by the foregoing operation of the control coils to attain stability. Also included in the sets of control coils is a circular cylindrical coil coaxial to the superconducting coils for adjusting the lift of the superconducting coils for fine adjustment of the height of the model above the superconducting coils.

Control of rotation of the model about the Z axis, this being a yaw movement of the model, is accomplished by additional assemblies of control coils within the set of control coil assemblies. A first of the yaw control assemblies (to be referred to as the $X^2$-$Y^2$ coil assembly) is composed of four flat pie-shaped coils positioned in an array which encircles the Z axis, the four coils being arranged in two pairs of coils. In one of the two pairs, the coils are disposed symmetrically on opposite sides of the Z axis and perpendicular to the X axis. In the second of the two pairs, the coils are disposed symmetrically on opposite sides of the Z axis and perpendicular to the Y axis. The second yaw control coil assembly (to be referred to as the XY coil assembly) has the same configuration as the first yaw control assembly, namely, a quadruple coil assembly, but is rotated in orientation about the Z axis by 45 degrees. Energization of the two yaw control assemblies provides a magnetic field distribution which torques the model to a desired orientation in yaw.

The model includes magnetic material with magnetization in one direction, the vertical direction, to facilitate control of position and orientation by use of the control coils. As a further feature of the construction of the control coil assembly, it is noted that the control coils are positioned near a metallic housing of the superconducting coils, the housing forming a part of a cryostat which cools the superconducting magnet coils. In order to minimize the generation of eddy currents in the housing which might impede rapid changes of magnetic fields of the control coils, and thereby interfere with rapid precision control of the model, each of the control coil assemblies includes also a shield coil positioned alongside the housing to cancel out the eddy currents.

BRIEF DESCRIPTION OF THE DRAWINGS

The aforementioned aspects and other features of the invention are explained in the following description, taken in connection with the accompanying drawing wherein:

FIGS. 9–13 show circuits for activating sets of the control coils for positioning the model in the three coordinate axes X, Y, and Z, and also in pitch, or roll, and yaw;

FIGS. 15–17 show details in the construction of a gripper of the mechanism of FIG. 14 for gripping the model, FIG. 15 being a stylized end view partially sectioned, FIG. 16 being an exploded fragmentary perspective view, and FIG. 17 showing diagrammatically a transverse exploded fragmentary section at the center of the gripper.

DETAILED DESCRIPTION OF THE INVENTION

Figure 1:
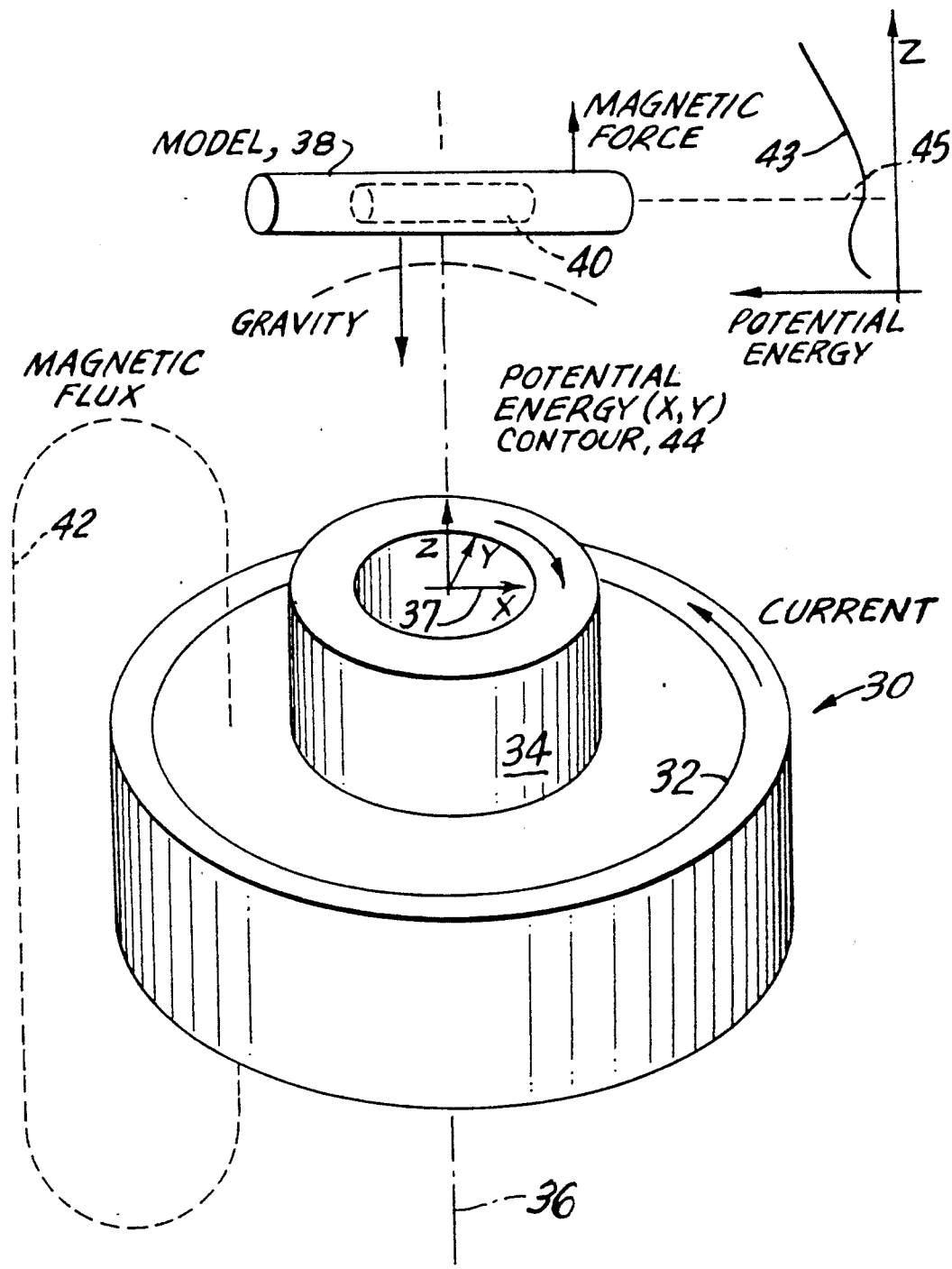
FIG. 1 is a perspective view, partially diagrammatic, of a model held above a superconducting electromagnet by a magnetic field produced by the magnet, the superconducting magnet comprising two coils arranged with one coil higher than the other in accordance with a first embodiment of the invention.
Figure 2:
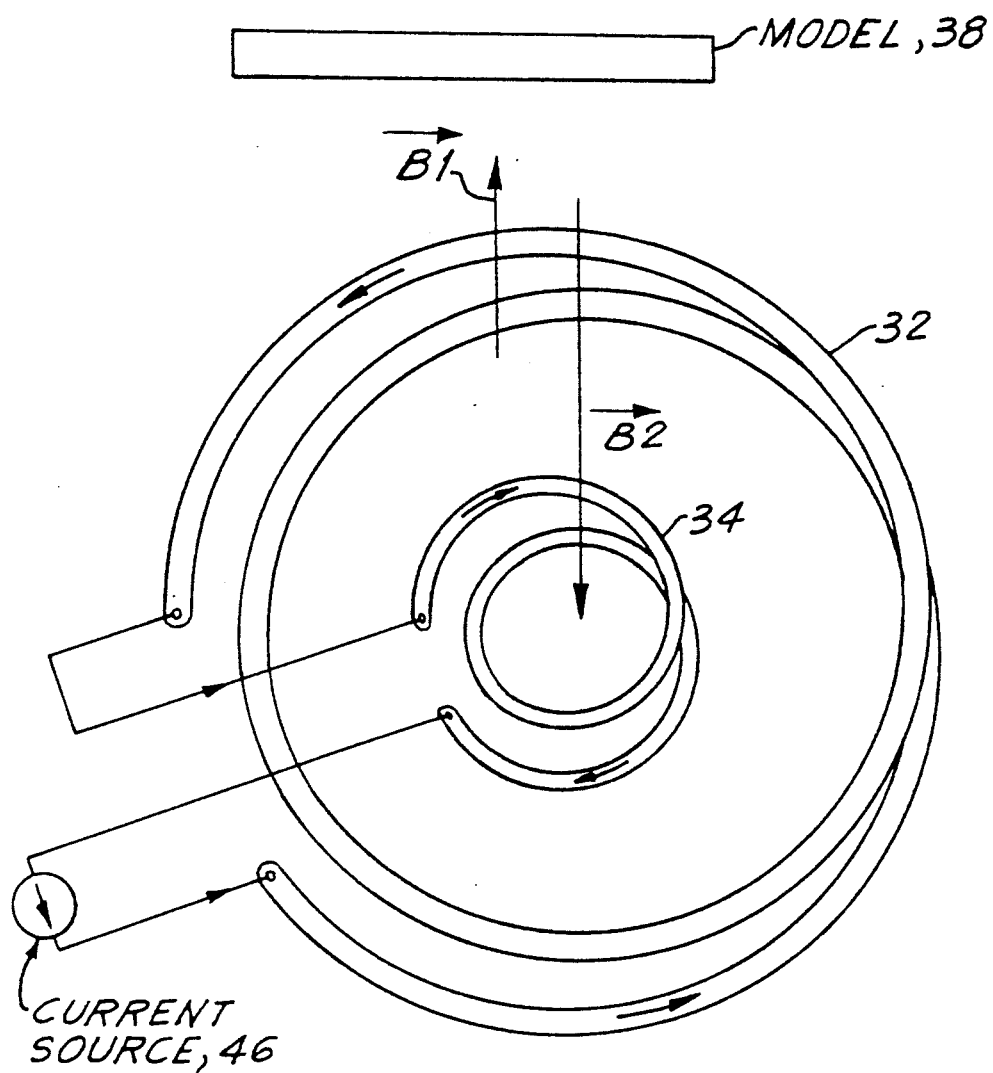
FIG. 2 is a schematic representation of the electrical connection of two coils of the magnet of FIG. 1.

With reference to FIGS. 1 and 2, the invention comprises a superconducting magnet 30 having a lower coil 32 and an upper coil 34 which are disposed symmetrically about a vertical central axis 36. A set of coordinate axes 37 is presented with the Z axis coinciding with the central axis 36, and with the X and the Y axes being perpendicular to each other and to the Z axis. Each of the coils 32 and 34 have a circular cylindrical form, the lower coil 32 having a larger diameter than the upper coil 34 and being positioned below the upper coil 34. An object to be levitated, namely, a model 38, is disposed above the upper coil 34, and is suspended in its position by a magnetic field gradient generated by the magnet 30. The model 38 may have any desired shape, an elongated cylindrical shape being shown in FIG. 1, by way of example. Included within the model 38 is an elongated slug 40 of magnetic material with magnetization vector parallel to the Z axis. Magnetic flux produced by the magnet 30 flows along an interior portion of the magnet 30 parallel to the axis 36, the flux being identified by a dashed line 42.

In accordance with a feature of the invention, the flux field produced by counter-rotating currents in the coils 32 and 34 of the magnet 30 is structured so as to produce a potential energy surface, shown in the Z direction by a graph 43 of the potential energy contour, and in the X and the Y directions by a contour 44. The contour 44 has a peak in the center along the axis 36. The graph 43 shows an increasing strength of the potential energy with increasing distance from the superconducting magnet 30, except for a depression 45 in the vicinity of the model 38. Due to the depression 45 in the Z coordinate of the potential energy field, the model 38 is urged by the magnetic field to the height of the depression 45 which represents a stable position in the Z coordinate of the potential energy field.

The magnetic field from the superconducting coil is designed such that the total potential energy of the model U (magnetic and gravitational potential energy) satisfy the following conditions at the equilibrium point:

$$\nabla V = 0 \qquad (1)$$

$$\frac{\partial^2 U}{\partial Z^2} = 0 \qquad (2)$$

These conditions are achieved in practice for small models by designing a superconducting coil which produces a first order field gradient in the Z-direction which balances the gravitational force of the model thus satisfying (1) and a second order field gradient in the Z-direction satisfying requirement (2). These two conditions guarantee stable equilibrium along the Z-axis.

In the X and the Y coordinates of the potential energy, the peaking of the contour 44 at the central axis 36 introduces an instability at the location of the model 38. As a result, upon the slightest offsetting of the model 38 from the central axis 36, the model 38 is urged away from the desired location at the axis 36 by the magnetic field of the magnet 30 in the absence of corrective fields to be introduced by control coils, as will be explained hereinafter.

The counter-rotating currents of the two coils 32 and 34 are accomplished by connecting the two coils 32 and 34 in series, as shown in FIG. 2, and applying current via a current source 46 through the series circuit of the two coils 32 and 34. The directions and magnitudes of the currents are selected as a matter of convenience in design of the coils. By way of example, the direction of current, as shown in FIGS. 1 and 2, is clockwise in the lower coil 32 to provide a magnetic induction vector B1 pointing upwards while, in the upper coil 34, a counterclockwise flow of current produces a magnetic induction vector B2 which points downward and is of larger magnitude than the vector B1 produced by the lower coil 32. The number of ampere-turns of the upper coil 34 is greater than that of the lower coil 32 for adjusting the relative sizes of the two vectors and the magnetic field gradients at the model 38. It is to be understood that the representation of the coils in FIG. 2 is schematic only, and that there are, typically, many turns of wire in each of the coils 32 and 34.

Figure 3:
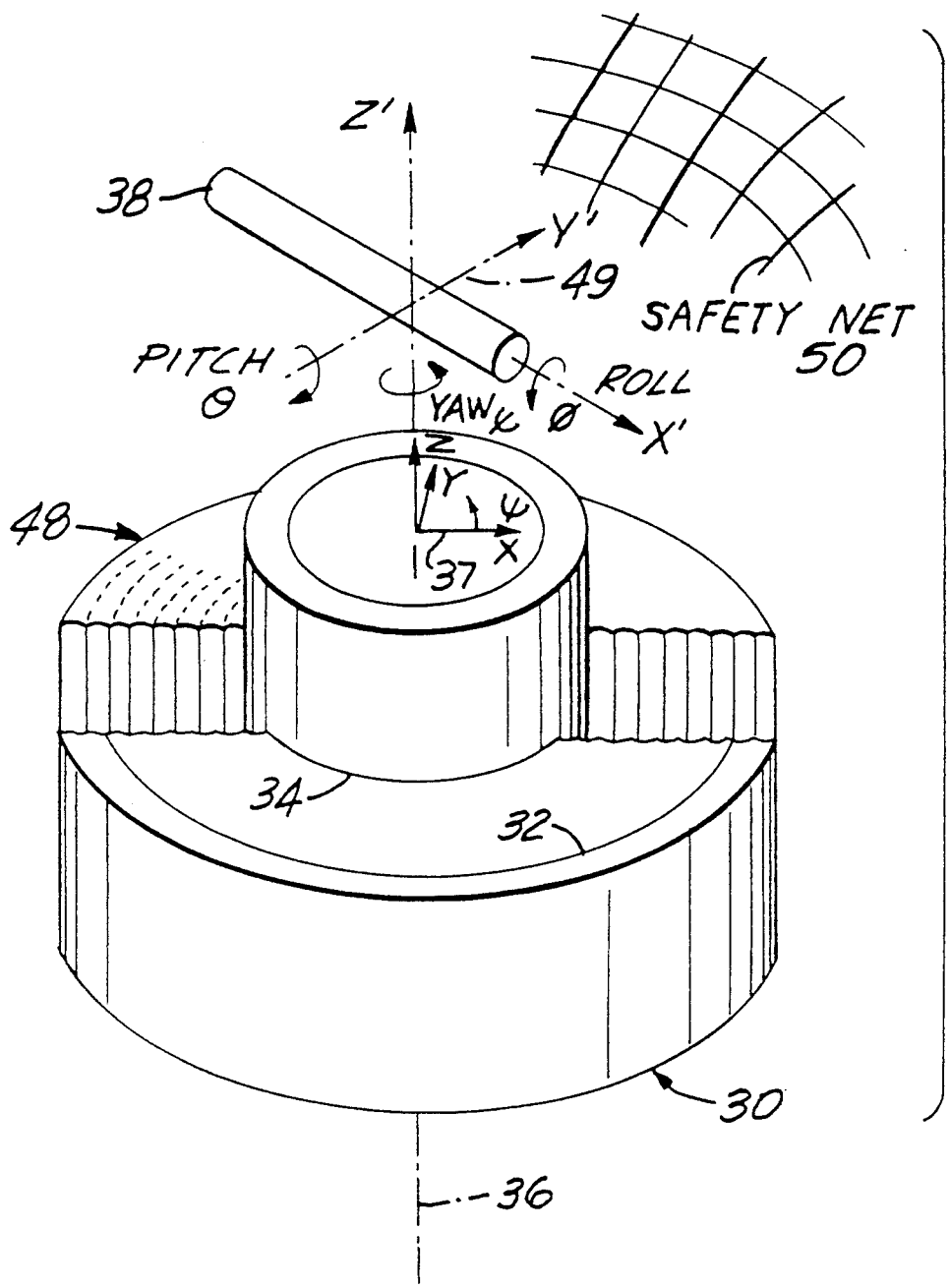
FIG. 3 is a stylized perspective view, partially diagrammatic, of the magnet of FIG. 1, the view including also an array of control coils disposed above the larger coil and around the smaller coil of the superconducting magnet in accordance with the first embodiment of the invention.

In accordance with the invention, and with reference to FIG. 3, control of the orientation or attitude of the model 38 at the desired location above the magnet 30 is attained by use of an assembly 48 of control coils. To facilitate description of the invention, FIG. 3 shows the coordinate axes 37 having coordinates X, Y and Z of the frame of reference of the magnet 30, and also shows a further set of coordinate axes 49 having coordinates X', Y', and Z' to serve as a frame of reference of the model 38. In the first embodiment of the invention, the control-coil assembly 48 is located above the lower coil 32 of the magnet 30, and concentrically surrounds the upper coil 34 of the magnet 30. The assembly 48 includes numerous sets of control coils, as will be described in detail hereinafter, which can be energized individually or in concert, and with adjustable amounts of current, so as to adjust the configuration of the field of the magnet 30 for displacing the model 38 along either of the three coordinate axes X, Y, and Z as well as for orientating the model 38 by a rolling movement about the X' axis and by a pitching movement about the Y' axis. The positive Z' direction is vertical and parallel to the axis 36. The X' and the Y' directions are horizontal when the model 38 is level, perpendicular to each other, and are perpendicular to the Z axis. Roll, pitch and yaw are indicated respectively by Greek letters phi, theta and psi. In the use of the magnet 30 and the control coils of the assembly 48 for positioning and orienting the model 38, if desired, one may employ a safety net 50 which envelops the model 38 to prevent accidental ejection of the model 38 by forces of the magnetic field of the magnet 30 in the event of accidental dislodgement of the model 38 from its designated location. The net 50 may be secured to a frame (not shown) which holds the net away from the model 38 and which may be mounted on a floor or other support surface which supports the magnet 30 during use of the magnet 30.

Figure 4:
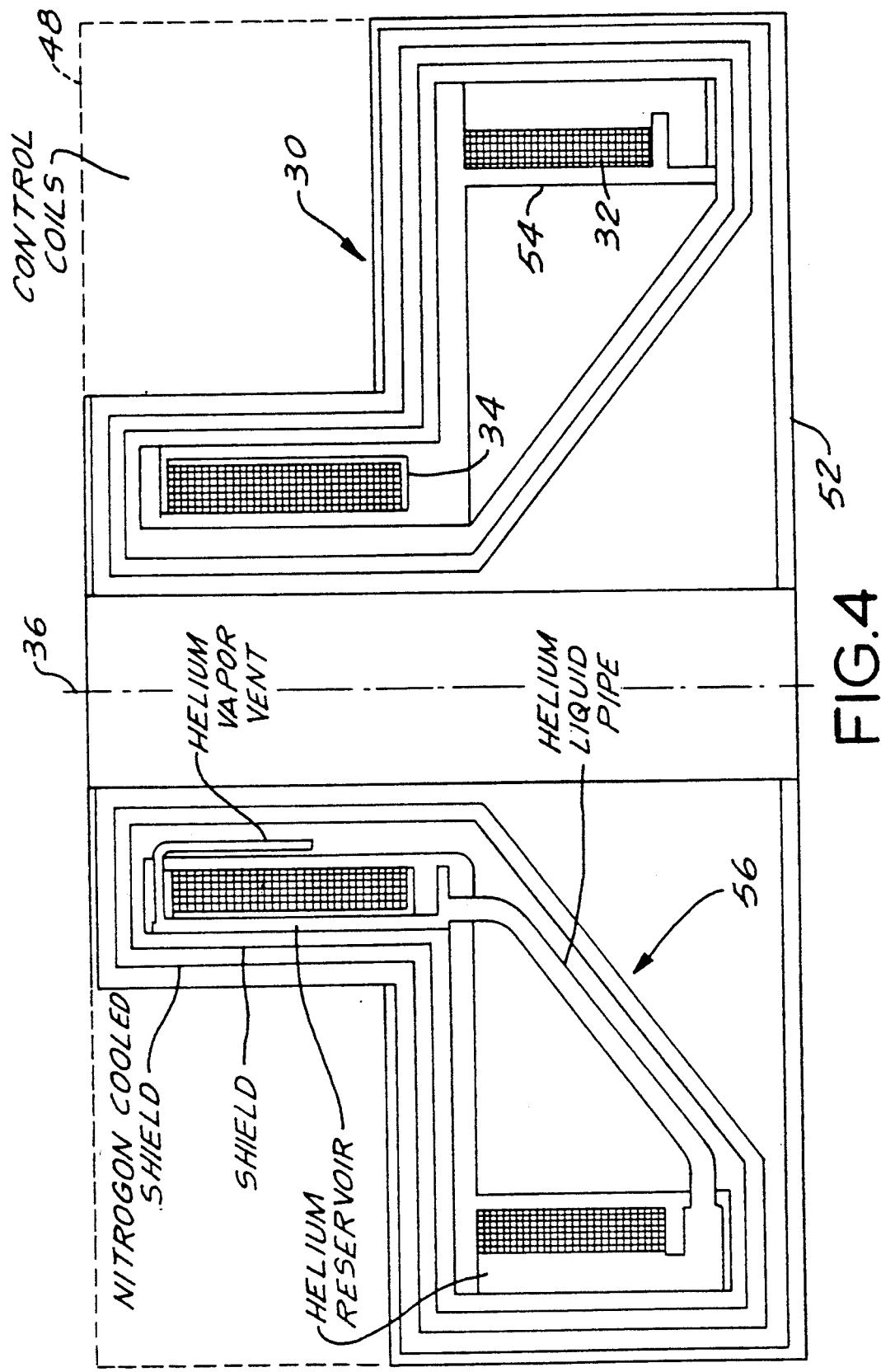
FIG. 4 is a diagrammatic sectional view of the superconducting magnet of FIG. 1 including reservoirs for liquid helium coolant.

FIG. 4 shows the construction of an enclosure 52 and a frame 54 within the enclosure 52 for supporting the coils 32 and 34 of the magnet 30, and for providing passages for helium and nitrogen coolant as indicated in FIG. 4. A cooled shield, shown diagrammatically in FIG. 4, in cooperation with the coolants, provides the necessary low-temperature operating environment as is required for operation of the superconducting materials of the coils 32 and 34 in a superconducting mode. The shield and the enclosure 52 are fabricated of a nonmagnetic metal such as aluminum. Also shown in FIG. 4 is the location of the control coils of the assembly 48. It is noted that direct current (DC) is employed in energizing the coils of the magnet 30, rather than alternating current (AC), so as to enable construction of the shields and the enclosure 52 and the frame 54 of metallic material. The entire assembly of the shields and supply of the nitrogen and the helium coolants constitutes a cryostat 56.

With respect to materials used in construction of the invention, the electrical conductors of the coils of the magnet 30 may be constructed, by way of example, of a superconductor such as niobium-titanium, NbTi. This is operative in a bath of liquid helium at one atmosphere pressure and at a temperature of 4.2 degrees (K). The superconductor is a NbTi multifilamentary wire composite composed of a core of NbTi filaments surrounded by a high purity copper shell. The operating current (typically 400 amperes) produces a magnetic field which is only approximately one-third the value of current which produces the critical field; this ensures that the magnet 30 is operated well within the superconducting region. In a preferred embodiment of the invention, stored energy in the magnet 30 is approximately 4.5 megajoules. The frame 54 includes a stainless steel, or aluminum, coil form for supporting the radial winding pressure in each of the coils 32 and 34. The resulting field of the magnet 30 is sufficient to space the model 38 at a large gap from the magnet 30, the gap being approximately three feet in a preferred embodiment of the invention. The control coils of the assembly 48 are located outside of the region cooled by the cryostat 56, and are operative at room temperature. The magnetic material of the model 38 is an alloy of neodymium-iron-boron. A typical weight of the permanent magnet material employed in the model 38 is in the range of approximately 2-20 pounds. The slug 40 of magnetic material of the model 38 is disposed within an outer cylindrical shell and is foraged as a set of discs cemented together in a stack approximately 1.25 inches in diameter and 5.84 inches in length. The overall dimensions of the model 38 are approximately 2 inches in diameter by 14 inches in length. The vacant spaces at both ends of the stack of magnetic material are suitable for housing a payload for conduction of experiments and measurements, and may include two electronic sensor packages (not shown) by way of example.

Figure 5:
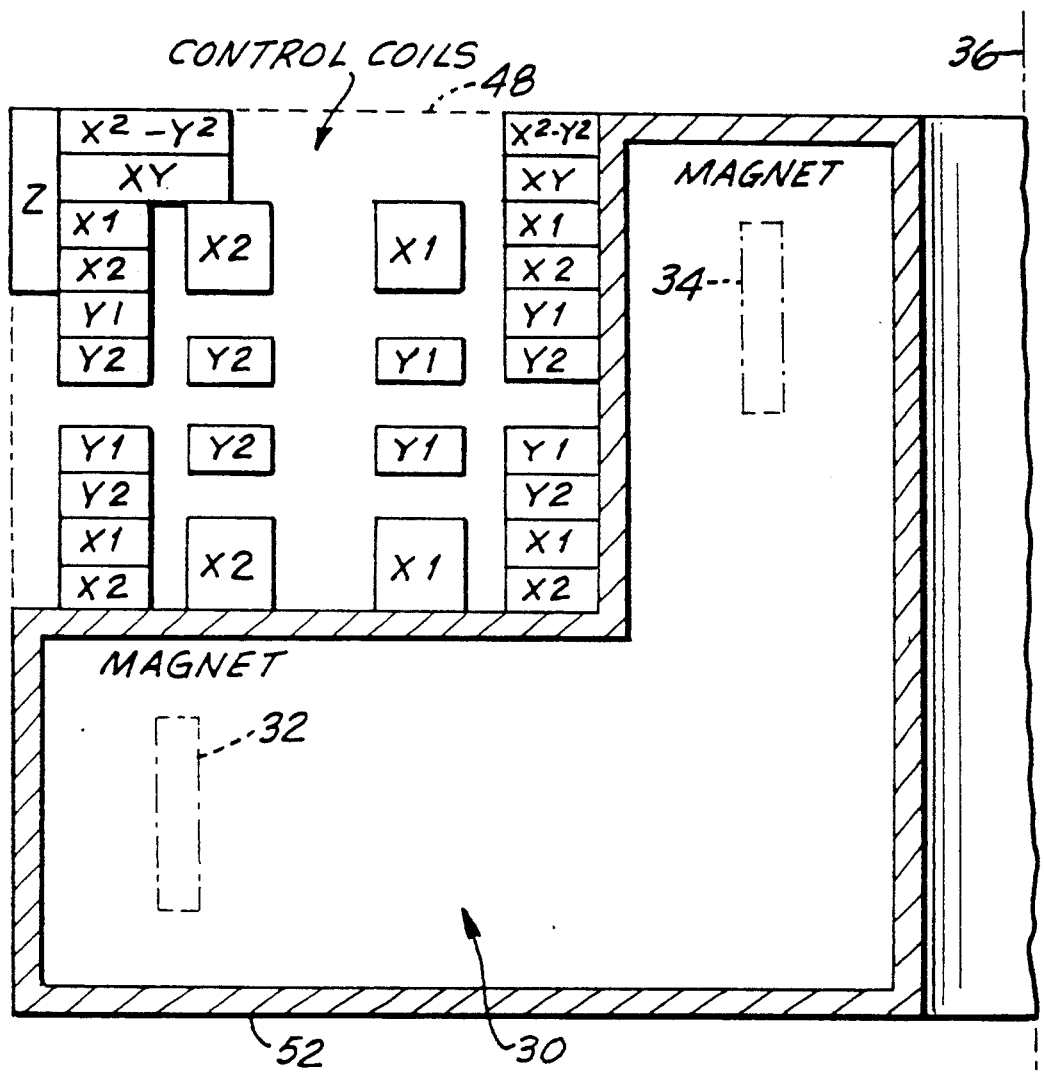
FIG. 5 is a partial view of an aluminum case surrounding the magnet coils of FIG. 4, the view showing diagrammatically the locations of placement of windings of a set of control coils in accordance with the first embodiment of the invention.

FIG. 5 shows, in accordance with the first embodiment of the invention, the arrangement of the various coils which make up the sets of coils in the coil assembly 48. The coils include a lift coil Z for raising and lowering the model 38 for adjusting its position along the axis 36. Four sets of coils are designated as the X1 set of coils, the X2 set of coils, the Y1 set of coils and the Y2 set of coils which serve to position the model 38 along the X and the Y coordinates, as well as to introduce pitch and roll adjustments to the orientation of the model 38. Two further sets of coils are each multiply sectioned, as will be described hereinafter, and serve to adjust the orientation of the model 38 in yaw, these additional two coils being identified by quadratic terms in X and in Y, namely the XY set of coils and the $X^2-Y^2$ set of coils.

Figure 6:
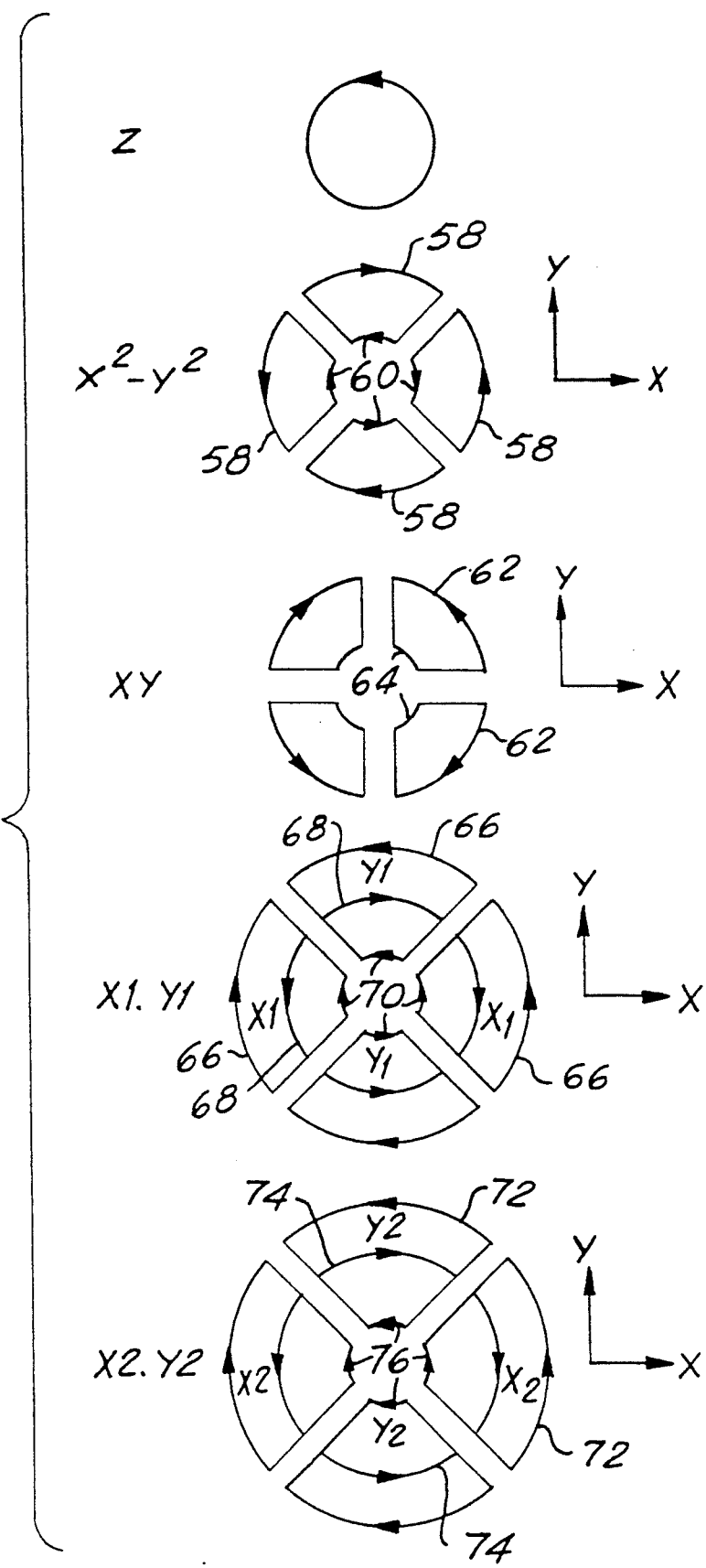
FIG. 6 shows a set of schematic representations of the control coils of FIG. 5, the representations of the coils in FIG. 6 being taken in plan view looking down upon the superconducting magnet of FIG. 5, this configuration of control coils being in accordance with the first embodiment of the invention

FIG. 6 shows the arrangement, in plan view, of the control coils described above in FIG. 5. The first coil shown at the top of FIG. 6 is the lift (Z) coil which is a single coil of circular configuration and encircles the upper coil 34 of the magnet 30. The next coil shown is the $(X^2-Y^2)$ coil which is composed of four sectors of pie-shaped configuration wherein two of the sectors are centered on the YZ plane and two of the sections are centered on the XZ plane. Each of the sectors includes a first arc segment 58 and a second arc segment 60, the first arc segment 58 being an outer arc segment and the second arc segment 60 being an inner arc segment. The four coil sectors are positioned symmetrically about the Z axis, and lie outside of the upper coil 34 of the magnet 30. Arrows indicate direction of current flow in each of the coil sectors. Current flow in the loop formed by the arc segments 58 and 60 of one sector is in the opposite sense to current flow in the loop of arc segments 58 and 60 in the adjacent sector. In the practice of the invention, the currents in each of the four sectors are equal, the ampere-turns in each of the first arc segments 58 are equal, and the ampere-turns in each of the second arc segments 60 are equal. Each sector may be energized by connection to a current source to provide the requisite current, a series connection being employed in this embodiment of the invention.

The next set of coils depicted is the XY set of coils which is constructed of four sectors of coils having the same configurations as the previous set of coils, but being rotated in position by 45 degrees about the Z axis relative to that of the previous set of coils. Thus, in the XY set of coils, one sector is oriented with its center line lying at 45 degrees, with the other three sectors being oriented respectively at 135 degrees, 225 degrees, and 315 degrees. Each sector includes a first arc segment 62 and a second arc segment 64 wherein the second arc segment 64 is closer to the Z axis and the first arc segment 62 is more distant from the Z axis. Current flow in the loop formed by the arc segments 62 and 64 of one sector is in the opposite sense to current flow in the loop of arc segments 62 and 64 in the adjacent sector.

The fourth coil arrangement shown in FIG. 6 is a composite of two coil arrangements, namely, the Y1 set of coils and the X1 set of coils. The coils have a flat pie configuration. Each of the sets of coils is divided into two sectors. The two sectors of the Y1 set of coils is centered along the YZ plane, and the two sectors of the X1 set of coils is centered along the XZ plane. There are three arc segments in each section. namely, a first arc segment 66, a second arc segment 68, and a third arc segment 70. The first arc segment 66 is the outermost arc segment, the third arc segment 70 is the innermost arc segment, and the second arc segment 68 is disposed at a location between the first and the third arc segments. Current direction is indicated by arrows on the respective arc segments. In each of the sectors of the Y1 set of coils, which coils are disposed diametrically on opposite sides of the Z axis, the current flow in the loop of arc segments 66 and 68 of one section is counterclockwise while in the other section the current flow in the loop of the arc segments 66 and 68 is in the opposite sense, namely, clockwise. Similarly, in the case of the X1 set of coils, the loop of current in the arc segments 66 and 68 of one sector flows in a clockwise direction while the corresponding current flow in the opposite sector is counterclockwise. Furthermore, in each sector, the current flowing through the third arc segment 70 and the second arc segment 68 form a loop having a direction of current circulation which is of the opposite sense to that of the loop of arc segments 66 and 68.

The configuration of sets of gradient coils, namely, the X2 set and the Y2 set at the bottom of FIG. 6 follows the same geometric arrangement of that of the preceding configuration of coils. In each sector of the Y2 coils and in each sector of the X2 coils, there is a first arc segment 72, a second arc segment 74 and a third arc segment 76 wherein the first arc segment 72 is the outermost arc segment, the third arc segment 76 is the innermost arc segment, and the second arc segment 74 is located at a radial distance from the Z axis between the first arc segment 72 and the third arc segment 76. The coil sectors have a flat pie configuration. The foregoing teachings of direction of coil currents set forth above with respect to the X1 and Y1 coil sets applies also to the X2 and the Y2 coil sets. The number of ampere-turns in the corresponding coils of the X2 and the Y2 coil sets may differ from the number of ampere-turns of the coils in the X1 and the Y1 coil sets. Centerlines of the Y2 sectors are parallel to the Y axis and centerlines of the X2 sectors are parallel to the X axis.

It is noted also that the innermost arc segments 70 and 76 (FIG. 6) are employed for purposes of attenuating any eddy currents which might otherwise be developed in the aluminum enclosure 52 (FIG. 4) which surrounds the upper coil 34 of the magnet 30, the enclosure extending through the center of the array of the control coils of the assembly 48. The locations and the number of ampere turns in each of the innermost arc segments 70 and 76 are selected for minimization of eddy currents. It is noted that, in the case of steady current flow in each of the control coils of the assembly 48, that there are no eddy currents. However, any type of vibratory or drifting movement of the model 38 will trigger a response on the part of a control system, to be described hereinafter, which rapidly applies currents, or varies existing currents, to the control coils to correct the orientation of the model 38. Such rapid changes in current may induce eddy currents in the metallic enclosure 52 and, accordingly, the arc segments 70 and 76 are employed for minimization of these eddy currents. In the X1 and the Y1 coil sets, in each sector of coils, the arc segments 66, 68, and 70 are connected in series to ensure proper relationship among the magnitudes of the currents in the respective arc segments. Similar comments apply to the arc segments 72, 74, and 76 in each sector of the X2 and the Y2 coil sets. Maintenance of the requisite ratio of current flow in the innermost arc segments 70 and 76 ensures minimization of the eddy currents. In the event that the enclosure were made of a nonmetallic material, such as plastic, then the innermost arc segments 70 and 76 would be reconfigured or eliminated entirely since the function of reducing eddy currents is no longer required.

Figure 7:
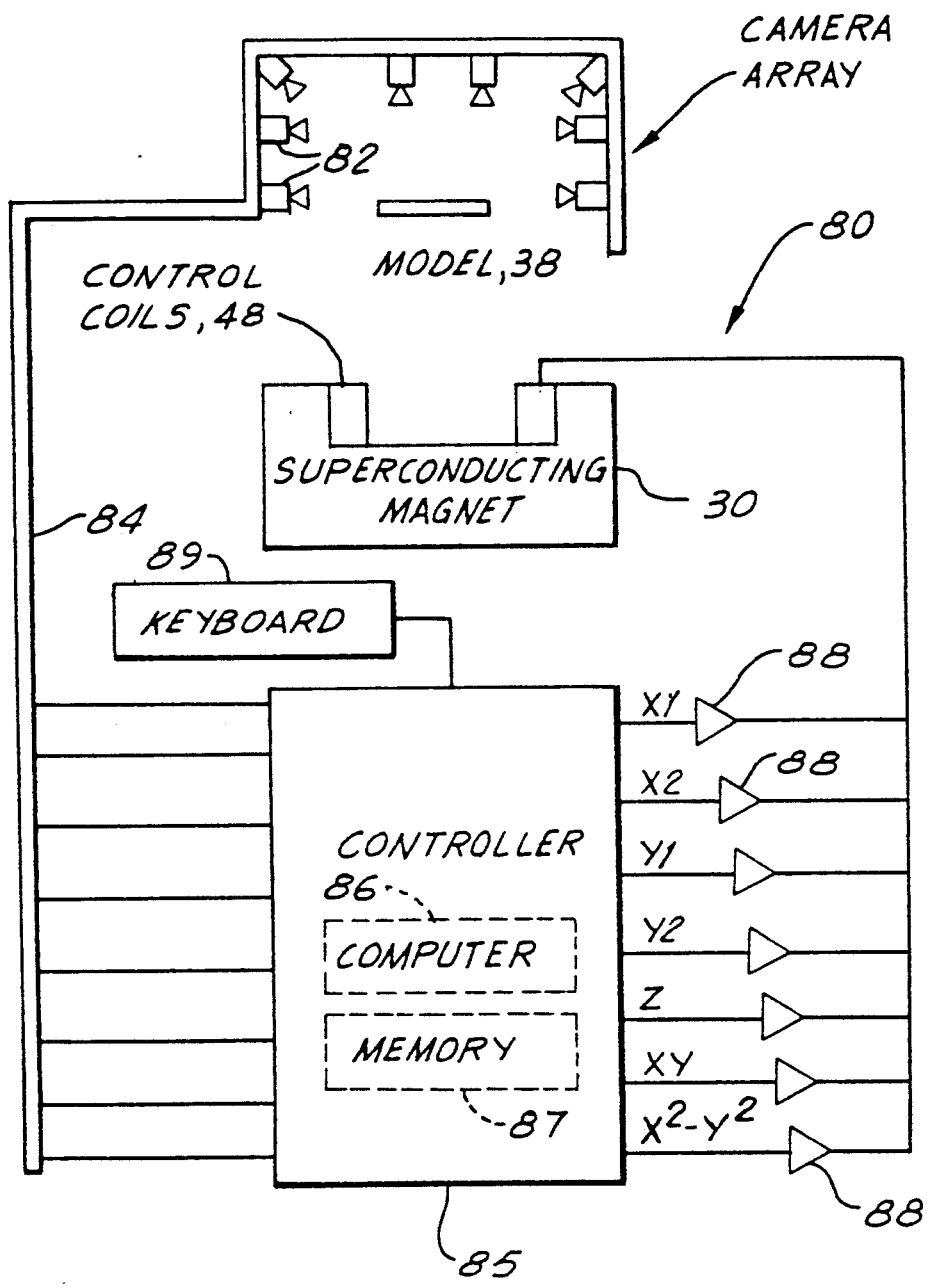
FIG. 7 is a block diagram of electrical interconnection circuitry for activation of the control coils in response to position data of the model provided by a set of eight cameras positioned for viewing the model.

FIG. 7 shows a control system 80 for applying currents to the control coils of the assembly 48 (FIG. 3). The system 80 includes an array of eight cameras 82 positioned for viewing the model 38, and outputting electric signals via a data bus 84 to a controller 85. Each of the cameras 82 is in the nature of a television camera and outputs signals which can be combined in the controller 85 to provide data as to the position and the orientation of the model 38. Included within the controller 85 are a computer 86 and a memory 87 which operate with the camera data and, in accordance with well-known programs for coordinate transformnation and triangulation, establish the coordinates of the model 38 in terms of the X, the Y and the Z coordinates, as well as in terms of angles of pitch, roll, and yaw. The controller 85 outputs signals via coil-driver amplifiers 88 to individual ones of the sets of coils indicated directly in the drawing by the legends X1, X2, Y1, Y2, Z, XY and ($X^2-Y^2$). The memory 87 stores necessary data, which may be entered via a keyboard 89, and programs for operation of the computer 86 to perform the foregoing calculations.

Figure 8:
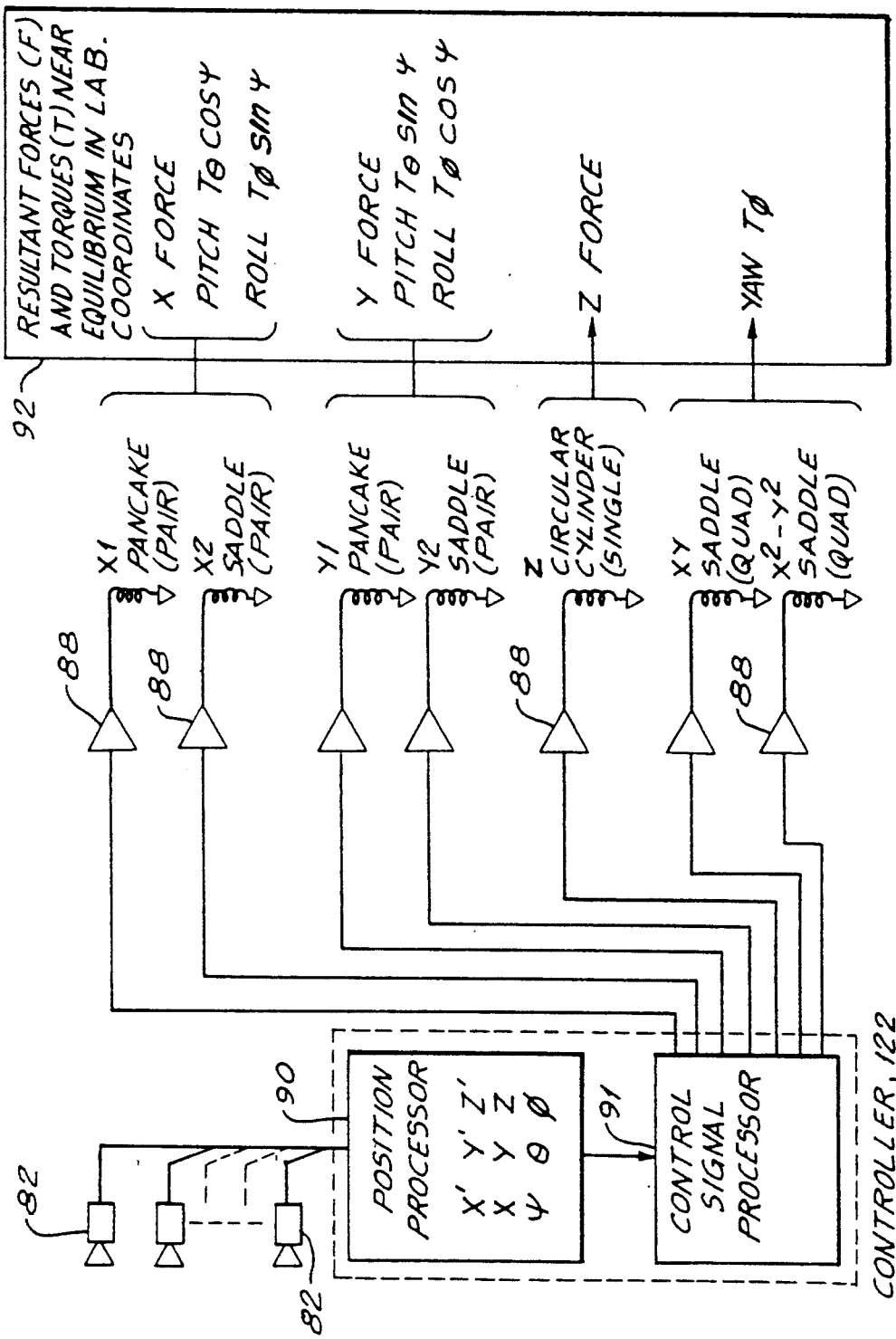
FIG. 8 shows schematically a set of signals developed by the circuitry of FIG. 7.

FIG. 8 shows operation of the controller 85 of FIG. 7. In terms of functional operation, the controller 85 may be viewed as comprising a position processor 90 and a control signal processor 91. The position processor 90 receives the signals from the cameras 82, and computes the position of the center of the model 38 in terms of the coordinate axes 37 of the superconducting magnet 30. The coordinate axes 37 of the superconducting magnet 30 may be regarded also a laboratory reference frame. The model 38 is provided with coloration or other marking which allows the cameras 82 to sense roll about the longitudinal axis X' of the model 38. The longitudinal shape of the model 38 allows the cameras 82 to sense pitch about the transverse axis Y' of the model 38 and yaw about the vertical axis Z of the magnet 30. This information of the model orientation is employed by the position processor 90 to compute the values of roll, pitch and yaw, and the respective angular velocities. At the control signal processor 91, the orientation and position of the model 38 is compared with a desired value of orientation and a desired value of position to develop error signals which represent the difference between the desired and actual values of the orientation and the position of the model 38. The memory 87 stores values of coil currents to be applied to various combinations of the control coils of the coil assembly 48 for accomplishing translation of the model 38 along each axis of the coordinate axes 37, and rotation of the model 38 about each axis of the coordinate axes 49 of the model 38.

As noted above, the model is inherently stable in the Z direction. The model 38 is also inherently stable in pitch and roll. Thus in generating servo control signals for positioning the model 38, only damping need be used in the correction of vertical position, pitch and roll. For correction of displacement in the X and the Y directions, and for correction of yaw, feedback is employed in the generation of the requisite servo signals. Displacement in a direction inclined to the X and the Y axes is accomplished by multiplication of the current values by sine and cosine of the angle of inclination to attain the requisite vectorial combination of X and Y values of displacement. This multiplication is performed by the computer 86. A corresponding use of sines and cosines is applied for rotation of the model 38 about an axis inclined to a coordinate axis of the coordinate axes 49 of the model 38. The requisite control currents are outputted from the control signal processor 91 via the amplifiers 88 to the respective control coils as shown in FIG. 8.

In FIG. 8, the results of combined operation of various combinations of the control coils is tabulated in a table 92. Thus, concurrent energization of the pair of X1 and the pair of X2 pie coils can produce an X displacement force, a pitch torque, or a roll torque. Introduction of cosine of the yaw angle and sine of the yaw angle provides for a tilting or rotation of the model 38 about a rotational axis. The rotational axis may be inclined to a coordinate axis of the coordinate axes 37 of the magnet 30. Thus, concurrent energization of the pair of Y1 and the pair of Y2 pie coils can produce an Y displacement force, a pitch torque, or a roll torque. Introduction of sine of the yaw angle and cosine of the yaw angle provides for a tilting or rotation of the model 38 about a rotational axis inclined to a coordinate axis of the coordinate axes 37 of the magnet 30. The Z coil, by itself, can introduce a vertical force. Concurrent energization of the quadrature XY pie-shaped coils and the quadrature ($X^{2-Y2}$) pie-shaped coils provides a torque in the yaw direction.

FIG. 9 shows implementation by the controller 85 of control of currents in the X1 and the X2 coil sets operative with power from power supplies 93 to produce a resulting magnetic field at 94 for adjustment of the position of the model 38. The circuitry of FIG. 9 can be implemented by specific circuit components as set forth in FIG. 9, or can be implemented by operation of the computer 86. In view of the fact that the operational speed of computers is suitable for updating the requisite currents in all of the control coils at a rate sufficient for orienting and positioning the model 38 with a designated orientation and position, it is the practice in a preferred embodiment of the invention to implement the circuit functions of FIG. 9 by use of the computer 86. Thus, an arithmetic logic unit 96 of the computer 86 outputs a desired value of the X component of the model position to a summing circuit at 98 which signifies the error between a desired, or reference value of the X position and produces an error signal at 100. The reference position is inputted by an operator of the equipment by use of the keyboard 89 connected to the controller 85 as shown in FIG. 7. Rate-aiding or velocity control, is also provided by the computer at block 104 which provides the derivative of displacement along the X coordinate, and includes a multiplicative damping factor for rate-aiding which is combined at a summing circuit 106 with the error signal at line 100. The error signal at line 100 is amplified by amplifier 108 prior to being applied to the summing circuit 106, the amplifier 108 providing forward loop gain.

The output signal of the summing circuit 106 is applied to the X1 coil set via a summing circuit 110 and an amplifier 112. The summing circuit 110 incorporates any bias or offset current value with the signal from the summing circuit 106. The amplifier 112 provides necessary gain for driving the coils of the X1 coil set with the requisite current. A fraction of the signal outputted by the summing circuit 106 is extracted at block 114, which may be a voltage divider circuit, and is applied via a summing circuit 116 and an amplifier 118 for driving current into the coils of the X2 coil set. There results a shift of magnetic field strength along the X axis with greater field strength being observed to one side of the central axis 36 than to the opposite side of the central axis 36. A resulting shift in magnetic potential energy is in the nature of the graph depicted to the right of the magnetic field 94 (FIG. 9).

The circuitry of FIG. 10 is the same as that of FIG. 9 and functions in the same fashion and, accordingly, need not be described in detail. The result is an offsetting of the magnetic field strength along the Y axis in response to a difference between a commanded value of the Y coordinate and a reference value, Yr, inputted by an operator of the system.

In FIG. 11, circuitry similar to that disclosed in FIG. 9 is employed to operate the Z control coil, the circuitry of FIG. 11 being simplified from that in FIG. 9 by the deletion of the components 110, 114, 116 and 118.

Figure 12:
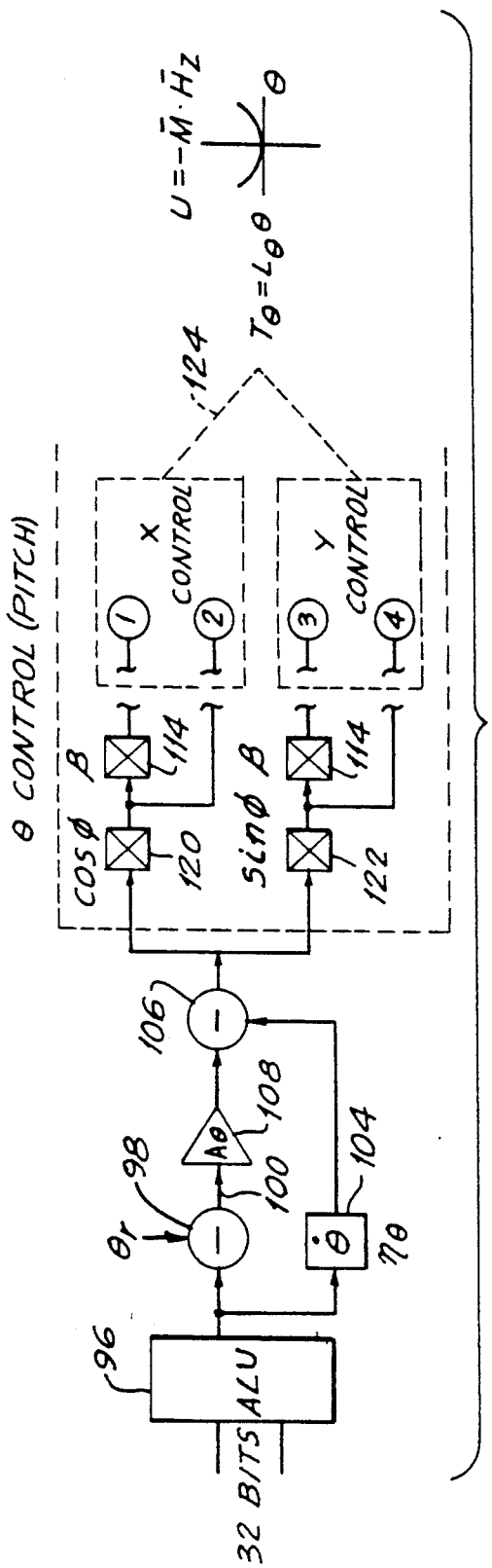

FIG. 12 employs the circuitry of both FIGS. 9 and 10, and outputs a signal from the summing circuit 106 via a cosine unit 120 and a sine unit 122 respectively to the X and the Y sets of control coils. The cosine unit 120 multiplies the signal of the summing circuit 106 by the cosine of the yaw angle. The sine unit 122 multiplies the signal of the summing unit 106 by the sine of the yaw angle. The bias or offset currents are also applied as indicated via the bias source identification numerals 1–4. There results a magnetic field at 124 which tends to offset the field of the magnet 30 to induce a pitching movement of the model 38. The resulting configuration of the potential energy contour is shown in a graph to the right of the magnetic field 124. By introduction of a 90 degree offset to the yaw angle, there results an offset of the field of the magnet 30 to induce a rolling movement of the model 38. Thereby, the model 38 can be reoriented both in pitch and in roll.

Figure 13:
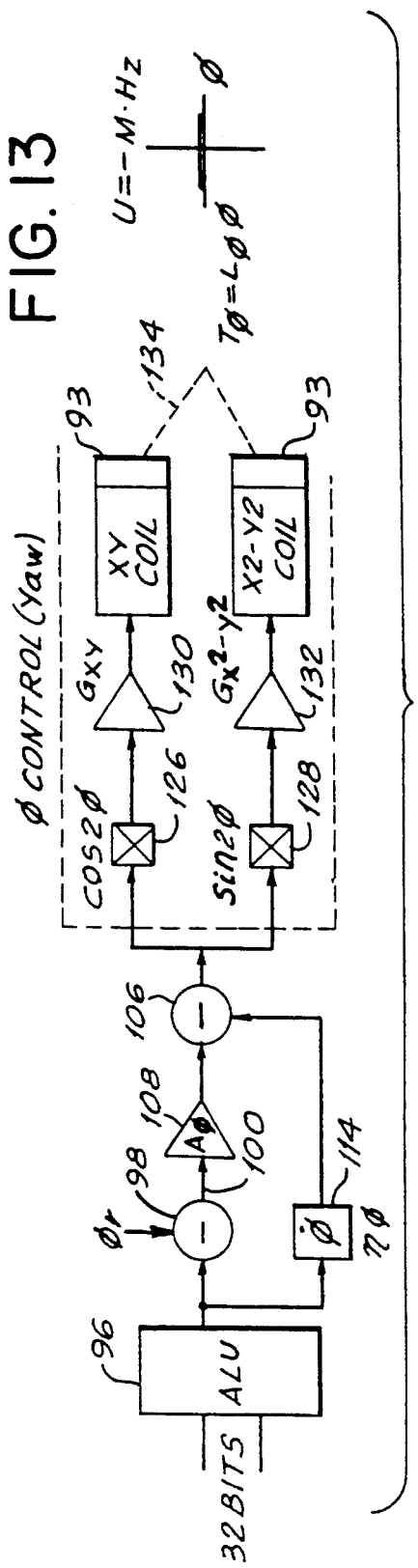

FIG. 13 shows circuit components already presented in FIG. 11 for producing coil current; however, in FIG. 13, coil currents are being applied to the XY coil set and the $X^2$-$Y^2$ coil set. The signal outputted by the summing circuit 106 is applied via a cosine unit 126 to the XY coil set, and via a sine unit 128 to the $X^2$-$Y^2$ coil set. The cosine unit 126 and the sine unit 128 are coupled via amplifiers 130 and 132 to the respective control coil sets, the amplifiers 130 and 132 providing suitable power amplification for driving currents in the coils of the respective coil sets. The cosine unit 126 multiplies the output signal of the summing circuit 106 by the cosine of twice the yaw angle. The sine unit 128 multiplies the output signal from the summing circuit 106 by the sine of twice the yaw angle. There results a magnetic field outputted by the coils at 134 which tends to rotate the model 38 about the yaw angle. As indicated in the graph to the right of the magnetic field 134, the magnetic potential energy contour introduced by the yaw control is flat, except for slight irregularities in the field caused by manufacturing tolerances of the superconducting magnet, so as not to introduce any pitching or heaving movement to the model 38.

Figure 14:
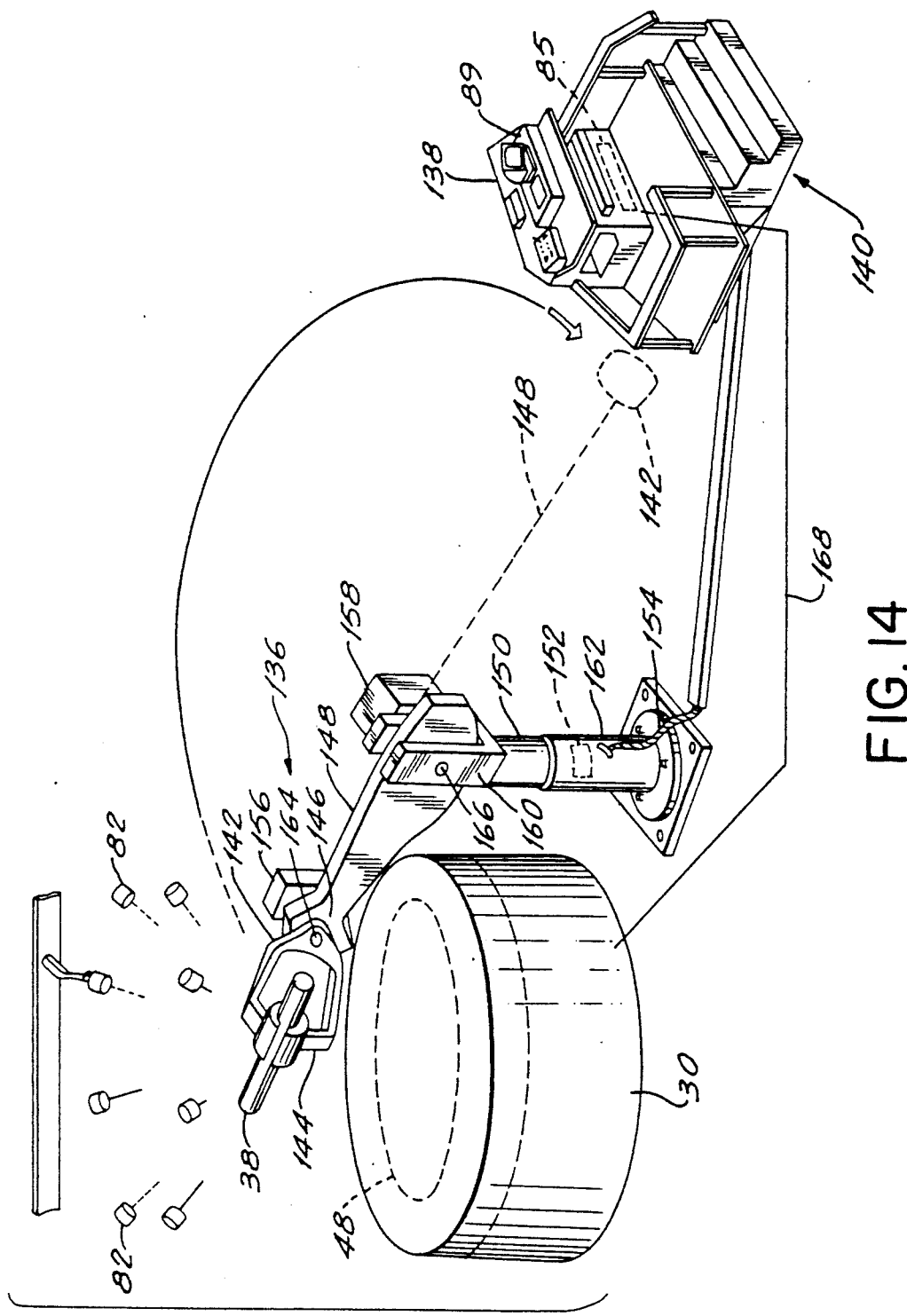
FIG. 14 shows a stylized view of a mechanism for insertion and extraction of the model at its desired location above the superconducting magnet.

FIG. 14 shows an insertion/retraction mechanism 136 operative with the control system 80 of FIG. 10 for positioning the model 38 at the desired location above the magnet 30 and wherein, after appropriate position, withdraws from the model 38 to allow the model 38 to be freely suspended or leviated within the fields of the superconducting magnet 30 and the control coils of the assembly 48. The mechanism 136 is operative with a console 138 in a control station 140. The console 138 includes the keyboard 89 (FIG. 7) by which the operator enters commands to the mechanism 136 includes a carriage 142 for transporting the model 38, the carriage 142 terminating in a gripper 144 which engages with the model 38. The carriage 142 is held pivotally by a pivot 146 to a swing arm 148 which rotates about a post 150 under power of a motor 152. A cable 154 provides for transmission of vacuum pressure, as will be described hereinafter, and also for transmission of electric signals between the gripper 144 and the controller 85 which is located in the console 138. The cable 154 also provides power to the motor 152, as well as to motors 156 and 158 which serve respectively to pivot the carriage 142 relative to the arm 148 about the pivot 146, and to pivot the arm 148 relative to the post 150 about a pivot 160. The motor 152 is supported by a base 162 which also supports the post 150 rotatably to allow for rotation of the arm 148 and the post 150 about an axis of the post 150. The motor 156 is supported by the arm 148 and imparts a pivoting movement to the carriage 142 by rotating a shaft 164 of the pivot 146. The motor 158 is supported by the pivot 160 and imparts a pivoting movement to the arm 148 by rotating a shaft 166 of the pivot 160.

In the operation of the mechanism 136, the arm 148 swings the carriage 142 to a position above the center of the magnet 30. Height and orientation of the carriage is adjusted by the pivots 146 and 160. Thereupon, the gripper 144 releases the model 38 gradually in the presence of the magnetic field of the magnet 30 and the control coils of the assembly 48, so as to transfer support of the model 38 from the carriage 142 to the magnetic field. Means to facilitate the transfer of the model 38 between the carriage 142 and the field will be described hereinafter. Upon completion of the transfer, the arm 148 is swung away from the magnet 30 to a point of convenience near or at the station 140, as indicated in phantom view. Electric current for operation of the control coils of the assembly 48 is applied from the console 138 via line 168.

With reference also to FIGS. 15–17, the gripper 144 comprises a bed 170 for engagement with the model 38, and a pair of opposed jaws 172 and 174 which serve to maintain the model 38 at or near to the bed 170. Vacuum ports 176 are located in the bed 170, and connect with a source of vacuum (not shown) via a hose 178 to hold the model 38 within the bed 170 under the force of vacuum pressure. The hose 178 passes within the cable 154 to the station 140 for control of the vacuum pressure. The bed 170 is supported by a frame 180 of the gripper 144. The jaws 172 and 174 are mounted pivotally by pivots 182 and 184, respectively, to the frame 180. A spring 186 connects with the jaws 172 and 174 to bias the jaws 172 and 174 via spring force in the open position wherein the model 38 is free to approach or to leave the bed 170. Application of vacuum pressure via a hose 188 overcomes the force of the spring 186 to close the jaws 172 and 174 toward the model 38. The hose 188 also passes within the cable 154 to the station 140 for control of the vacuum pressure. In the gripper 144, the hose 188 connects with a vacuum circuit 190 which operates two pistons 192 and 194 by displacing the pistons 192 and 194 under vacuum pressure against the jaws 172 and 174, thereby to accomplish a desired opening and closing of the jaws 172 and 174. Two screws 196 and 198 are carried by the jaws 172 and 174, respectively, for butting against the bed 170 to serve as stops to a closing movement of the jaws 172 and 174. It should be appreciated that the gripper insertion tool is formed of non-magnetic material.

The invention also provides for sensor of force of the magnetic field upon the model 38, such as a strain gauge 200 which is located on a connecting region 202 of the frame 180 with the carriage 142 to measure changes in force directed to the carriage 142 by the model 38 under the influence of the magnetic fields of the magnet 30 and the coil assembly 48. Electric signals outputted by the strain gauge 200 are transmitted via the cable 154 to the station 140 to provide data describing an approach of the model 38 to a stable point in altitude of the potential energy profile along the Z axis of the magnet 30. At the stable point, the magnetic field provides an upward force which balances the downward force of gravity upon the model 38. Thus, the weight of the gripper 144 is the same weight obtained for an empty gripper. Away from the stable point, sideways and/or vertical forces are sensed which signal the controller 85 as to the requisite direction of movement of the model 38 for proper placement at the stable point along the vertical dimension of the potential energy profile.

Thereby, the invention is provided with means for altering the configuration of the field of a superconducting magnet so as to permit both manual and automatic positioning and orienting of the model freely suspended above the superconducting magnet by the magnetic field.

It is to be understood that the above described embodiment of the invention is illustrative only, and that modifications thereof may occur to those skilled in the art. Accordingly, this invention is not to be limited to the embodiment disclosed herein, but is to be limited only as defined by the appended claims.

We claim:

1. A magnetic suspension system comprising:
   a lift magnet comprising a first superconducting coil and a second superconducting coil arranged about a common vertical axis and being energized with counter rotating currents to generate a magnetic field gradient which lifts an object above said magnet, said first and said second coils producing a potential energy surface above said magnet with a depression on said vertical axis for urging said object under forces of gravity and magnetism to a stable location at the depression;
   an assembly of control coils disposed about said vertical axis for adjusting orientation of said object;
   first energizing means coupled to said first and said second superconducting coils for operating said first and said second superconducting coils in a steady state mode; and
   second energizing means for energizing said control coils to adjust said magnetic field gradient for directing said object to the axis and adjusting orientation and position of said object.

2. A system according to claim 1 wherein energizing individual ones of said control coils establishes a desired orientation of said object.

3. A system according to claim 1 wherein said control coil assembly includes a cylindrical coil mounted coaxially with said first and said second coils for adjusting a vertical component of said magnetic field gradient.

4. A system according to claim 1, wherein said control coil assembly includes a first array of four control coil sectors disposed symmetrically about said vertical axis, said four control coil sectors of said first array being arranged as a first pair of diametrically opposed coil sectors and a second pair of diametrically opposed coil sectors circumferentially located between the coil sectors of said first pair.

5. A system according to claim 4 further comprising current means for applying currents to said first pair of coil sectors and said second pair of coil sectors independently of each other.

6. A system according to claim 5 wherein said current means provides currents which circulate in the same direction in the coil sectors of a pair of the coil sectors.

7. A system according to claim 6 wherein the direction of current produced by said current means in one pair of control coil sectors is opposite the direction of current produced by said current means in the other pair of control coil sectors.

8. A system according to claim 4 wherein said control coil assembly includes a second array of four control coil sectors disposed symmetrically about said vertical axis and offset about said vertical axis by forty five degrees from said first array of control coil sectors, said four control coil sectors of said second array being arranged as a first pair of coil sectors which are diametrically opposed and a second pair of coil sectors which are diametrically opposed and located between the coil sectors of said first pair of coil sectors of said second array.

9. A system according to claim 8 further comprising current means for applying currents to said first pair of coil sectors and said second pair of coil sectors of said second array independently of each other.

10. A system according to claim 9 wherein said current means provides currents which circulate in the same direction in the coil sectors of a pair of the coil sectors.

11. A system according to claim 10 wherein the direction of current produced by said current means in one pair of control coil sectors of said second array is opposite the direction of current produced by said current means in the other pair of control coil sectors of said second array.

12. A system according to claim 8 wherein each of the coil sectors of said first array and of said second array comprises at least one turn of an electrical conductor wherein said at least one turn includes a first portion and a second portion, said first portion extending in a direction perpendicular to a radius of said first array and said second portion extending in a direction perpendicular to a radius of said second array, respectively.

13. A system according to claim 12 wherein each of the coils of said first array and said second array has a planar form and is disposed in a plane perpendicular to said vertical axis.

14. A system according to claim 13 wherein said control coil assembly further comprises a third array of four control coil sectors and a fourth array of four control coil sectors disposed symmetrically about said vertical axis and offset about said vertical axis by forty five degrees from said second array of four control coil sectors, said third array and said fourth array of control coil sectors each comprising a first pair of sectors and a second pair of coil sectors disposed in a common plane and being interleaved among each other;
   wherein each of the coil sectors of said third array and said fourth array comprises at least one turn of an electrical conductor and a branch of an electrical conductor;
   said at least one turn including a first portion and a second portion, said first portion, said second portion and said branch in each of said third and said fourth arrays extending in a direction perpendicular to a radius of said third array and a radius of said fourth array, respectively, said branch being located facing a center of the array for each control coil sector of said third and said fourth arrays.

15. A system according to claim 14 wherein
   said first array of four control coil sectors constitutes an $X^2$-$Y^2$ coil set;
   said second array of four control coil sectors constitutes an XY coil set;
   in said third array of four control coil sectors, said first pair of coil sectors constitutes an X1 coil set, and said second pair of coil sectors constitutes a Y1 coil set; and
   in said fourth array of four control coil sectors, said first pair of coil sectors constitutes an X2 coil set, and said second pair of coil sectors constitutes a Y2 coil set.

16. A system according to claim 1 further comprising positioning means for insertion of said object into a location above said lift magnet and for extraction of said object from said location above said lift magnet, said positioning means including gripper means for engaging said object.

17. A system according to claim 16 further comprising console means for activating said gripper means to release said object, and wherein said object is magnetized with a 18. A method for supporting an object above a lift magnet by magnetic levitation, the method comprising:
providing said lift magnet with a first superconducting coil disposed about a vertical axis of said lift magnet and a second superconducting coil coaxial to said first coil about said vertical axis;
energizing said first and said second superconducting coils with counter-rotating currents to generate a magnetic field gradient, and a potential energy surface above said lift magnet with a depression on said vertical axis for urging said object under forces of gravity and magnetism to a stable location at the depression;
arranging an assembly of control coils about said vertical axis; and
energizing said control coils to adjust said magnetic field gradient for adjusting orientation and position of said object.

19. A method according to claim 18 further comprising the step of operating said first and said second coils in a steady state mode.

20. A method according to claim 18 further comprising a step of configuring individual ones of said control coils as planar pie-shaped coils.

21. A method according to claim 18 further comprising a step of locating said control coils symmetrically about said vertical axis.

22. A method according to claim 18 further comprising steps of constructing a coil of said control coil assembly as a cylindrical coil, and mounting said cylindrical coil coaxially with said first and said second coils for adjusting a vertical component of said magnetic field gradient.

23. A method according to claim 22 further comprising steps of arranging four control coils of said control coil assembly symmetrically about said vertical axis in a first array of coil sectors, said four control coil sectors of said first array being arranged as a first pair of diametrically opposed coil sectors and a second pair of diametrically opposed coil sectors circumferentially located between the coil sectors of said first pair.

24. A method according to claim 23 further comprising steps of arranging additional four control coils of said control coil assembly symmetrically about said vertical axis in a second array of coil sectors, and offsetting said second array of coil sectors about said vertical axis by forty five degrees from said coil sectors of said first array, said additional four control coil sectors of said second array being arranged as a third pair of diametrically opposed coil sectors and a fourth pair of diametrically opposed coil sectors circumferentially located between the coil sectors of said third pair.

25. A method according to claim 24 wherein
said first array of four control coil sectors constitutes an $X^2-Y^2$ coil set; and
said second array of four control coil sectors constitutes an XY coil set.

26. A method according to claim 24 wherein
said second array of four control coil sectors constitutes an XY set of coils; and
in said first array of four control coil sectors, said first pair of coil sectors constitutes an X1 coil set, and said second pair of coil sectors constitutes a Y1 coil set.

27. A method according to claim 24 further comprising a step of applying currents to said first pair of coil sectors and said second pair of coil sectors in each of said arrays independently of each other.

28. A method according to claim 24 further comprising a step of providing currents which circulate in the same direction in the coil sectors of a pair of the coil sectors of said first array and of said second array.

29. A method according to claim 24 further comprising a step of applying current in a direction in one pair of control coil sectors in either one of said arrays which is opposite a direction of current in the other pair of control coil sectors of said one array.

30. A method according to claim 18 further comprising a step of employing a positioning device for insertion of said object into a location above said lift magnet and for extraction of said object from said location above said lift magnet.

31. A method according to claim 30 wherein said step of employing said positioning device includes a step of gripping said object by a gripper which forms a part of said positioning device.

* * * * *